(12) United States Patent
Bangsaruntip et al.

(10) Patent No.: US 8,936,972 B2
(45) Date of Patent: Jan. 20, 2015

(54) EPITAXIALLY THICKENED DOPED OR UNDOPED CORE NANOWIRE FET STRUCTURE AND METHOD FOR INCREASING EFFECTIVE DEVICE WIDTH

(75) Inventors: Sarunya Bangsaruntip, Mount Kisco, NY (US); Guy Cohen, Mohegan Lake, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 13/596,234

(22) Filed: Aug. 28, 2012

(65) Prior Publication Data
US 2014/0034908 A1  Feb. 6, 2014

Related U.S. Application Data

(63) Continuation of application No. 13/564,121, filed on Aug. 1, 2012, now abandoned.

(51) Int. Cl.
*H01L 21/84* (2006.01)
*H01L 29/06* (2006.01)

(52) U.S. Cl.
USPC .. 438/149; 257/9; 257/E21.409; 257/E29.022

(58) Field of Classification Search
None
See application file for complete search history.

(56) References Cited

U.S. PATENT DOCUMENTS

| | | | |
|---|---|---|---|
| 7,727,830 B2 | 6/2010 | Jin et al. | |
| 7,884,004 B2 | 2/2011 | Bangsaruntip et al. | |
| 7,902,540 B2 | 3/2011 | Cohen | |
| 8,030,186 B2 | 10/2011 | Romano et al. | |
| 2004/0112964 A1* | 6/2004 | Empedocles et al. | 235/491 |
| 2010/0193770 A1* | 8/2010 | Bangsaruntip et al. | 257/24 |
| 2010/0295022 A1* | 11/2010 | Chang et al. | 257/24 |
| 2011/0133161 A1 | 6/2011 | Bangsaruntip et al. | |
| 2011/0133169 A1 | 6/2011 | Bangsaruntip et al. | |
| 2011/0278546 A1 | 11/2011 | Bangsaruntip et al. | |

OTHER PUBLICATIONS

"Silicon-on-insulator technology," J.P. Colinge, pp. 50-51 (1997).
"Semiconductor wafer bonding," Q.Y. Tong and U. Gosele, pp. 72-76 (1999).

* cited by examiner

*Primary Examiner* — Michael Lebentritt
*Assistant Examiner* — Kevin Quinto
(74) *Attorney, Agent, or Firm* — Louis J. Percello; Michael J. Chang, LLC

(57) ABSTRACT

Techniques for increasing effective device width of a nanowire FET device are provided. In one aspect, a method of fabricating a FET device is provided. The method includes the following steps. A SOI wafer is provided having an SOI layer over a BOX, wherein the SOI layer is present between a buried nitride layer and a nitride cap. The SOI layer, the buried nitride layer and the nitride cap are etched to form nanowire cores and pads in the SOI layer in a ladder-like configuration. The nanowire cores are suspended over the BOX. Epitaxial sidewalls are formed over the sidewalls of the nanowires cores. The buried nitride layer and the nitride cap are removed from the nanowire cores. A gate stack is formed that surrounds at least a portion of each of the nanowire cores and the epitaxial sidewalls.

22 Claims, 9 Drawing Sheets

TOP-DOWN VIEW

CROSS-SECTION A1-A2 VIEW

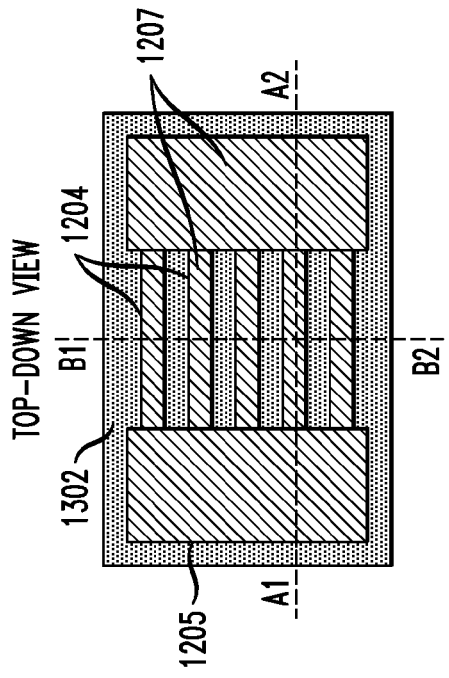
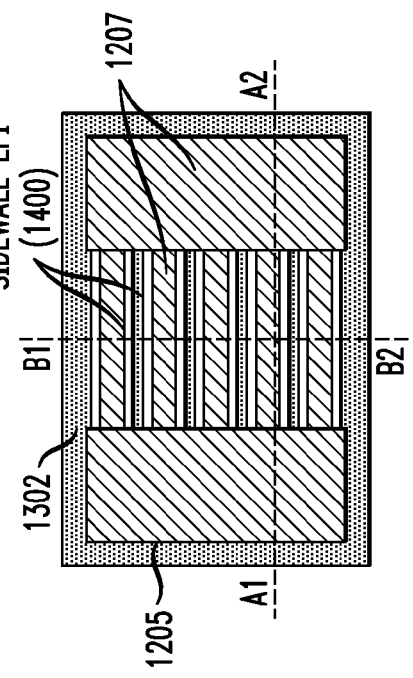
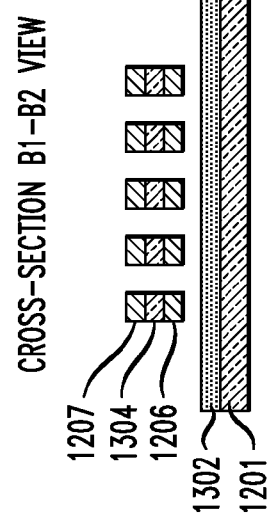
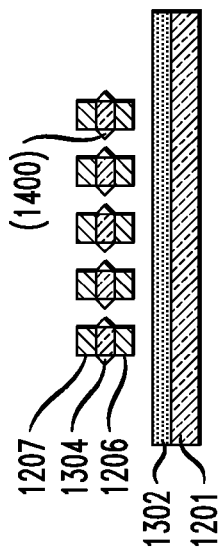

TOP-DOWN VIEW

CROSS-SECTION B1-B2 VIEW (ZOOM IN)

EPITAXIALLY THICKENED DOPED OR
UNDOPED CORE NANOWIRE FET
STRUCTURE AND METHOD FOR
INCREASING EFFECTIVE DEVICE WIDTH

CROSS-REFERENCE TO RELATED
APPLICATION(S)

This application is a continuation of U.S. application Ser. No. 13/564,121 filed on Aug. 1, 2012, the disclosure of which is incorporated by reference herein.

FIELD OF THE INVENTION

The present invention relates to nanowire field effect transistor (FET) devices and more particularly, to techniques for increasing effective device width of a nanowire FET device by forming a doped or undoped epitaxial shell around a doped or undoped nanowire core.

BACKGROUND OF THE INVENTION

As scaling conventional planar complementary metal-oxide semiconductor (CMOS) becomes increasingly challenging, several non-planar device structures have been considered. One such non-planar device structure is a gate all around field effect transistor (FET). A gate all around FET achieves superior short channel characteristics from the electrostatics that the geometry of the structure provides. In fact, in some situations there is actually overscaling (i.e., better electrostatics than required).

However, one issue with gate all around FETs is in maintaining effective device width scaling after the various nanowire formation processes. One solution to this problem is to create stacked layered structures. To create layered structures, however, creates additional process complexities. Another solution is to pattern large nanowires which, as patterned, have a small spacing between the nanowires. Such a patterning process, however, is very difficult to control and to produce a reliable yield.

Therefore, techniques for maintaining desired device width in process flows that involve nanowire thinning would be desirable.

SUMMARY OF THE INVENTION

The present invention provides techniques for increasing effective device width of a nanowire field effect transistor (FET) device by forming a doped or undoped epitaxial shell around a doped or undoped nanowire core. In one aspect of the invention, a method of fabricating a FET device is provided. The method includes the following steps. A semiconductor-on-insulator (SOI) wafer is provided having an SOI layer over a buried oxide (BOX). Nanowire cores and pads are etched in the SOI layer, wherein the pads are attached at opposite ends of the nanowire cores in a ladder-like configuration. The nanowire cores are suspended over the BOX. The nanowire cores may optionally be thinned (e.g., prior to the growth of the epitaxial shell to allow for varying ratio of core-to-shell thickness). Epitaxial shells are formed surrounding each of the nanowire cores. A gate stack is formed that surrounds at least a portion of each of the nanowire cores and the epitaxial shells, wherein the portions of the nanowire cores and the epitaxial shells surrounded by the gate stack serve as channels of the device, and wherein the pads and portions of the nanowire cores and the epitaxial shells that extend out from the gate stack serve as source and drain regions of the device.

In another aspect of the invention, a FET device is provided. The FET device includes a wafer having a BOX; nanowire cores and pads attached at opposite ends of the nanowire cores in a ladder-like configuration on the BOX, wherein the nanowire cores are suspended over the BOX; epitaxial shells surrounding each of the nanowire cores; and a gate stack that surrounds at least a portion of each of the nanowire cores and the epitaxial shells, wherein the portions of the nanowire cores and the epitaxial shells surrounded by the gate stack serve as channels of the device, and wherein the pads and portions of the nanowire cores and the epitaxial shells that extend out from the gate stack serve as source and drain regions of the device.

In yet another aspect of the invention, a method of fabricating a FET device is provided. The method includes the following steps. A SOI wafer is provided having an SOI layer over a BOX, wherein the SOI layer is present between a buried nitride layer beneath the SOI layer and a nitride cap above the SOI layer. The SOI layer, the buried nitride layer and the nitride cap are etched to form nanowire cores and pads in the SOI layer, wherein the pads are attached at opposite ends of the nanowire cores in a ladder-like configuration, wherein the buried nitride layer is present beneath each of the nanowire cores and the nitride cap is present on top of each of the nanowire cores, and wherein sidewalls of the nanowire cores are exposed. The nanowire cores are suspended over the BOX. Epitaxial sidewalls are formed over the sidewalls of the nanowires cores. The buried nitride layer and the nitride cap are removed from the nanowire cores. A gate stack is formed that surrounds at least a portion of each of the nanowire cores and the epitaxial sidewalls, wherein the portions of the nanowire cores and the epitaxial sidewalls surrounded by the gate stack serve as channels of the device, wherein the pads and portions of the nanowire cores and the epitaxial sidewalls that extend out from the gate stack serve as source and drain regions of the device.

In still yet another aspect of the invention, a FET device is provided. The FET device includes a wafer having a BOX; nanowire cores and pads attached at opposite ends of the nanowire cores in a ladder-like configuration on the BOX, wherein the nanowire cores are suspended over the BOX; epitaxial sidewall covering sidewalls of the nanowire cores and which extend along each of the nanowire cores in a plane parallel to the BOX; and a gate stack that surrounds at least a portion of each of the nanowire cores and the epitaxial sidewalls, wherein the portions of the nanowire cores and the epitaxial sidewalls surrounded by the gate stack serve as channels of the device, wherein the pads and portions of the nanowire cores and the epitaxial sidewalls that extend out from the gate stack serve as source and drain regions of the device.

A more complete understanding of the present invention, as well as further features and advantages of the present invention, will be obtained by reference to the following detailed description and drawings.

BRIEF DESCRIPTION OF THE DRAWINGS

FIG. 14A is a cross-sectional diagram illustrating another perspective of the suspended nanowire cores which illustrates how sidewalls of the suspended nanowire cores are exposed while top and bottom surfaces of the suspended nanowire cores are covered by the top the nitride cap and the buried nitride layer according to an embodiment of the present invention;

FIG. 14B is a top-down diagram of the structure of FIG. 14A according to an embodiment of the present invention;

FIG. 15A is a cross-sectional diagram illustrating selective epitaxy having been used to add epitaxial sidewalls over exposed sidewall surfaces of the suspended nanowire cores according to an embodiment of the present invention;

FIG. 15B is a top-down diagram of the structure of FIG. 15A according to an embodiment of the present invention;

DETAILED DESCRIPTION OF PREFERRED EMBODIMENTS

Provided herein are techniques for maintaining effective device width scaling in gate all around nanowire field effect transistor (FET) devices following nanowire thinning by growing a doped or undoped epitaxial shell around either a doped or undoped core device. The present techniques will now be described by way of reference to FIGS. 1-10 which illustrate an exemplary nanowire FET device fabrication process flow.

The fabrication process begins with a semiconductor-on-insulator (SOI) wafer. See FIG. 1. An SOI wafer typically includes a layer of a semiconductor material (also commonly referred to as a semiconductor-on-insulator layer or SOI layer) separated from a substrate by an insulator. When the insulator is an oxide (e.g., silicon dioxide ($SiO_2$)), it is commonly referred to as a buried oxide, or BOX. According to the present techniques, the SOI layer will serve as an active layer of the device in which nanowire cores and pads will be patterned (see below).

Figure 1:
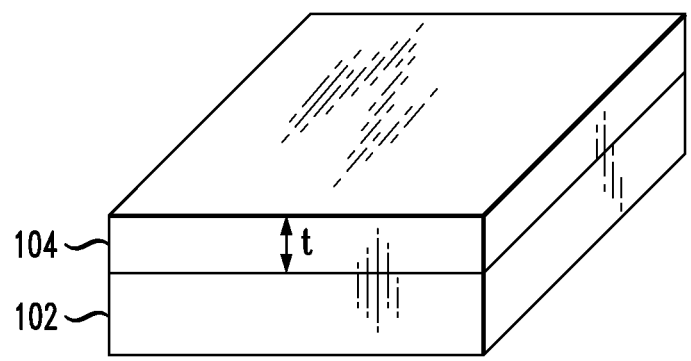
FIG. 1 is a three-dimensional diagram illustrating a semiconductor-on-insulator (SOI) wafer having a SOI layer over a buried oxide (BOX) which is a starting platform for fabrication of a nanowire field effect transistor (FET) device according to an embodiment of the present invention.

In the example shown in FIG. 1, the starting wafer includes an SOI layer 104 over a BOX 102. For ease of depiction, a substrate typically located below the BOX 102, is not shown. According to an exemplary embodiment, SOI layer 104 is formed from a semiconducting material, such as silicon (Si) (e.g., single-crystalline silicon), silicon germanium (SiGe) or silicon carbon (SiC). Thus, the SOI layer 104 may also be referred to as a "semiconductor device layer" or simply as a "semiconductor layer."

According to an exemplary embodiment, SOI layer 104 preferably has a thickness of from about 5 nanometers (nm) to about 40 nm. Commercially available SOI wafers typically have a thicker SOI layer. Thus, the SOI layer of a commercial wafer can be thinned using techniques such as oxidative thinning to achieve the desired active layer thickness for the present techniques.

Optionally, the SOI layer 104 may be doped such that when nanowire cores are patterned in the SOI layer 104, the cores will likewise be doped. This step is optional, since it may be desirable to leave the nanowire cores undoped.

Thus in some embodiments, a p-type or n-type dopant may be used to dope the SOI layer 104. By way of example only, if the device being produced is an n-channel nanowire FET, then it may be desirable to implant a p-type dopant into the SOI layer 104 (resulting in p-doped nanowire cores, see below). Suitable p-type dopants include, but are not limited to, boron. Alternatively, when the device being produced is a p-channel nanowire FET, then it may be desirable to implant an n-type dopant into the SOI layer 104 (resulting in n-doped nanowire cores, see below). Suitable n-type dopants include, but are not limited to, phosphorous and arsenic. As will be described below, doping the nanowire cores can be done to mitigate short channel effects, especially in the case of thicker nanowires.

According to an exemplary embodiment, the doping of the SOI layer 104 is performed by ion implantation of dopants into the SOI layer 104 followed by an activation anneal (e.g., at a temperature of from about 600 degrees Celsius (° C.) to about 1,100° C.). Other methods to dope the SOI layer 104, including (but not limited to) plasma doping or solid source diffusion, followed with a subsequent anneal, could also be used.

As provided above, one challenge with a gate all around nanowire FET device architecture is the low active device width. Unlike a planar device (where 100% of the device width contributes to active device width), gate all around devices must leave some space in between the nanowires for gate materials to wrap around on the nanowires. As highlighted above, this decrease in active device width can be compensated for by making a stacked (multi-layer) nanowire structure. However, yielding such a structure adds significant complexity in processing.

As also highlighted above, another solution is to decrease the pitch of nanowires and thus reduce the spacing between them. Still at any given pitch, patterning larger nanowires with smaller spacing will result in larger active device width. However, current lithography and patterning limits make yielding large nanowires with small spacing a difficult process, particularly when the pitch of the nanowire is scaled down to below 50 nm.

Advantageously, by way of the present techniques, smaller nanowires with larger spacing are first patterned and then an epitaxial shell is formed around the nanowires to increase the nanowire size and at the same time reduce the spacing. This process serves to increase the active device width while maintaining the nanowire pitch. See description of FIG. 11, below, describing device width, spacing and pitch. This epitaxial shell can also optionally be doped. Therefore, any combination of doped/undoped core and doped/undoped shell may be employed according to the present techniques. This is the core/shell configuration mentioned above.

Further, as highlighted above, doping the nanowire cores can be done to mitigate short channel effects, especially in the case of thicker nanowires. Namely, doping (to control short channel effects) is preferred when thicker nanowires are used, and the nanowires may be undoped if they are thinner. By way of example only, nanowires having a diameter of from about 3 nm to about 14 nm, e.g., a diameter of from about 5 nm to about 10 nm, may be undoped. Nanowires with a diameter of greater than about 14 nm would generally benefit from core doping.

Figure 2:
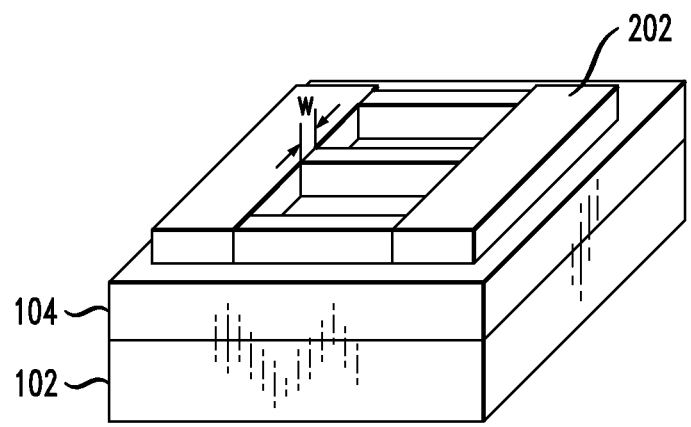
FIG. 2 is a three-dimensional diagram illustrating a nanowire hardmask having been formed on the SOI layer according to an embodiment of the present invention.

Patterning of the nanowire cores is now described. As shown in FIG. 2, standard lithography techniques are used to form a hardmask 202 which will be used to pattern the nanowire cores and pads in the SOI layer 104 (also referred to herein as a nanowire/pad lithography hardmask). By way of example only, hardmask 202 can be formed by blanket depositing a suitable hardmask material (e.g., a nitride material, such as silicon nitride ($Si_3N_4$)) over the SOI layer 104 and then patterning the hardmask material using a standard photolithography process with the footprint and location of the hardmask 202. It is notable that the use of a hardmask is being used herein merely to illustrate the present techniques, and that other possible configurations may be implemented by one of skill in the art. For instance, a soft mask (e.g., resist) (not shown) can instead be used to pattern the nanowire cores and pads in the SOI layer 104.

As shown in FIG. 2, the nanowire/pad hardmask has a ladder-like configuration. This ladder-like configuration will be transferred to the active layer, wherein the nanowire cores will be patterned like rungs of a ladder interconnecting the pads (see below). The pads (and portions of the cores) will be used to form source and drain regions of the nanowire FET device.

An etch through the hardmask 202 is then used to form the nanowire cores and pads in the SOI 104. See FIG. 3. As provided above, the nanowire cores may be doped or undoped. Doping of the nanowire cores can serve to mitigate short channel effects, especially when thicker nanowires (e.g., nanowires having a diameter of greater than about 14 nm) are used.

Figure 3:
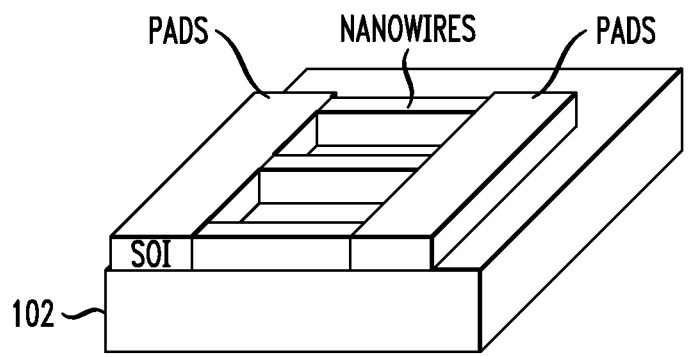
FIG. 3 is a three-dimensional diagram illustrating the hardmask having been used to pattern nanowire cores and pads in the SOI layer and the hardmask having been removed according to an embodiment of the present invention.
Figure 4:
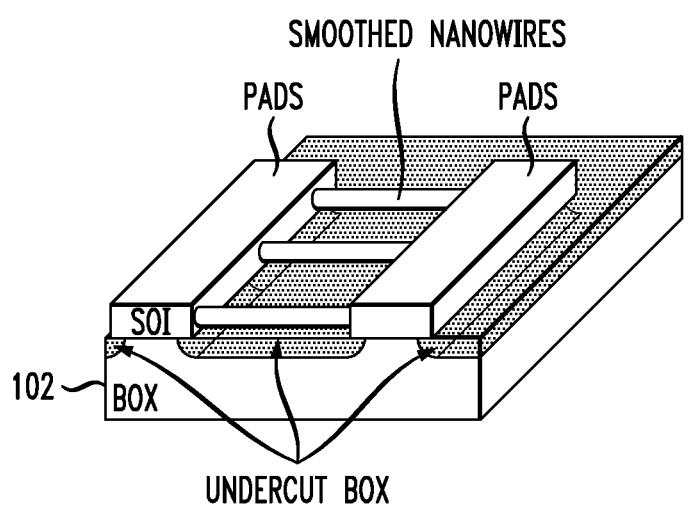
FIG. 4 is a three-dimensional diagram illustrating the nanowire cores having been suspended over the BOX by undercutting the BOX beneath the nanowires, and the nanowire cores having been smoothed according to an embodiment of the present invention.
Figure 5:
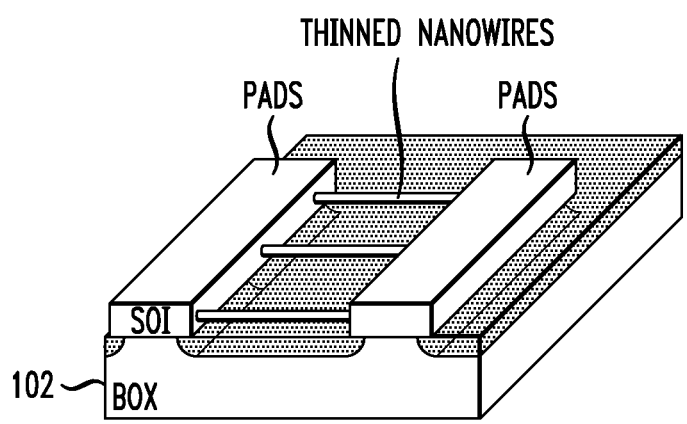
FIG. 5 is a three-dimensional diagram illustrating the nanowire cores having been thinned according to an embodiment of the present invention.

According to an exemplary embodiment, this etch is performed using reactive ion etching (RIE). For example, this RIE step may be performed using a fluorine-containing, e.g., $CHF_3/CF_4$, or bromine chemistry. As shown in FIG. 3, the nanowire cores and pads are formed having a ladder-like configuration. Namely, the pads are attached at opposite ends of the nanowire cores like the rungs of a ladder. The hardmask 202 may be removed at this stage with a selective wet etch process.

The nanowire cores are then suspended over the BOX. See FIG. 4. According to an exemplary embodiment, the nanowire cores are suspended by undercutting the BOX 102 beneath the cores using an isotropic etching process. This process also laterally etches portions of the BOX 102 under the pads. See FIG. 4. The isotropic etching of the BOX 102 may be performed, for example, using a diluted hydrofluoric acid (DHF). A 100:1 DHF etches about 2 nm to about 3 nm of BOX layer 102 per minute at room temperature.

Following the isotropic etching of the BOX 102 the nanowire cores are preferably smoothed to give them an elliptical and in some cases a circular cross-sectional shape. The smoothing of the nanowire cores may be performed, for example, by annealing the nanowire cores in a hydrogen-containing atmosphere. Exemplary annealing temperatures may be from about 600° C. to about 1,000° C., and a hydrogen pressure of from about 600 torr to about 700 torr may be employed. Exemplary techniques for suspending and re-shaping nanowires may be found, for example, in U.S. Pat. No. 7,884,004, issued to Bangsaruntip et al., entitled "Maskless Process for Suspending and Thinning Nanowires," the entire contents of which are incorporated by reference herein. During this smoothing process, the nanowire cores are thinned. According to one exemplary embodiment, the nanowire cores at this stage have an elliptical cross-sectional shape with a cross-sectional diameter (e.g., measured along a major axis of the ellipse) of from about 7 nm to about 35 nm.

Optionally, the nanowire cores can be thinned further. See FIG. 5. As described in conjunction with the description of FIG. 4, the nanowire cores may be re-shaped (e.g., smoothed) to an elliptical (e.g., circular) cross-sectional shape earlier in the process. Now, the nanowire cores may be further thinned, which also can serve to give them a smoother surface. Thinning the nanowire cores prior to the growth of the epitaxial shell (see below) also allows for varying ratio of core-to-shell thickness.

By way of example only, the nanowire cores may be further thinned at this step using a high-temperature (e.g., from about 700° C. to about 1,000° C.) oxidation of the nanowire cores followed by etching of the grown oxide. The oxidation and etching process may be repeated multiple times to achieve desired nanowire dimensions. According to one exemplary embodiment, the nanowire cores at this stage after being further thinned have a cylindrical cross-sectional shape with a cross-sectional diameter of from about 2 nm to about 30 nm.

As provided above, the nanowires will serve as (doped or undoped) cores around which an epitaxial shell will be formed. The epitaxial shell will serve to increase the device width/decrease the channel spacing. See FIG. 11, described below. It is also notable that portions of the nanowire cores/epitaxial shell surrounded by the gate stack (see below) will serve as the channels of the device, while portions of the nanowire cores/epitaxial shell extending laterally out from the gate stack will (in conjunction with the pads) serve as source and drain regions of the device.

Figure 6:
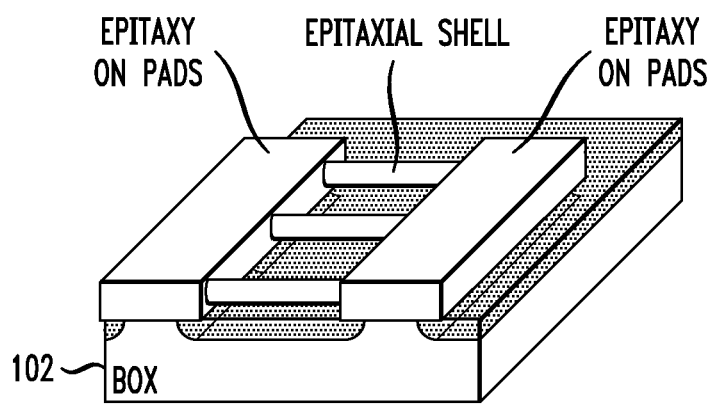
FIG. 6 is a three-dimensional diagram illustrating an epitaxial material having been formed on the nanowire cores (as a shell) and also on the pads according to an embodiment of the present invention.

The epitaxial shell is then formed around the nanowire cores. See FIG. 6. As provided above, the epitaxial shell serves to increase the effective device width, and thereby decrease the spacing between adjacent channels. The shell can be formed from epitaxial Si, SiGe or SiC. As shown in FIG. 6, this process will also result in epitaxial Si, SiGe or SiC being formed on the pads.

It is notable that in this step of forming the epitaxial shell around the nanowire cores, it is important to prevent merging the nanowires during the epitaxy process, otherwise a gate all around FET cannot be formed. Namely, room is needed for the gate between the nanowires. Epitaxy growth rates have to be known well enough to avoid filling in the nanowire to nanowire completely. Given the present teachings, one of skill in the art would be able to ascertain the appropriate processing conditions to prevent merging of the nanowires. By way of example only, at a minimum, a distance of from about 7 nm to about 10 nm is preferably left between adjacent nanowires.

With this nanowire core/epitaxial shell process and structure, the configuration of the device can beneficially be tailored to the particular application at hand. For instance, it may be desirable to employ a different material for the shell than that used in the core. By way of example only, growing an epitaxial Si shell on a SiGe core will impart tensile strain in the channel. Tensile strain in the channel is favorable when an n-channel nanowire FET is being formed. Alternatively, growing an epitaxial SiGe shell on a Si core will impart compressive strain in the structure. The strain may induce buckling in the suspended nanowires. The onset for buckling depends on the nanowire length and cross-section, so proper design off the nanowire dimensions could avert buckling. Compressive strain in the channel is favorable when a p-channel nanowire FET is being formed. Alternatively, the same material can be used for both the nanowire core and for the epitaxial shell.

As described above, the nanowire cores can be doped or undoped and the epitaxial shell can be doped or undoped (i.e., intrinsic Si, SiGe or SiC). To dope the epitaxial material on the pads and the epitaxial shells, a dopant may be introduced during the epitaxy step for example by co-flowing $PH_3$ or $AsH_3$ to obtain n-type doping or $B_2H_6$ to obtain p-type doping. The techniques for use of a dopant during epitaxy are generally known to those of skill in the art and thus are not described further herein. Suitable p-type and n-type dopants were provided above.

By way of example only, a chemical vapor deposition (CVD) reactor may be used to perform the epitaxial growth. For example, for silicon epitaxy, precursors include, but are not limited to, $SiCl_4$, $SiH_4$ combined with HCL. The use of chlorine allows selective deposition of silicon only on exposed silicon. A precursor for SiGe growth may be $GeH_4$, which may obtain deposition selectivity without HCL. Precursors for dopants may include $PH_3$ or $AsH_3$ for n-type doping and $B_2H_6$ for p-type doping. Deposition temperatures may range from about 550° C. to about 1,000° C. for pure silicon deposition, and as low as 300° C. for pure Ge deposition. The epitaxy process is repeated twice when doping is used, since the pFET has to be doped with n-type dopant and the nFET with p-type dopant. Moreover, the devices that are used for pFETs need to be masked during the epitaxy for nFETs and vice-a-versa.

According to one exemplary embodiment, when the nanowire cores are doped, the epitaxial shells are doped with a dopant of an opposite polarity from the nanowire cores. This doping configuration is also referred to herein as "counter-doping." Thus, when the nanowire cores are p-doped, in this example the epitaxial shells are n-doped, and vice-a-versa. Again, suitable n-type and p-type dopants were provided above. Counter-doping serves to reduce the impact of the dopants (if any) that can migrate from the nanowire cores into the shell.

According to an exemplary embodiment where both the nanowire cores and the epitaxial shells are doped, the dopant concentration in the epitaxial shells is less than the dopant concentration in the nanowire cores (i.e., the shell is lightly doped). By way of example only, the nanowire cores may be doped at a concentration of from about $1\times10^{18}$ $cm^{-3}$ to about $7\times10^{18}$ $cm^{-3}$ while the epitaxial shells are doped at a concentration of from about $1\times10^{17}$ $cm^{-3}$ to about $5\times10^{17}$ $cm^{-3}$. By more heavily doping the nanowire cores (as compared to the epitaxial shells), beneficial electrostatic short-channel effects are achieved (i.e., if the core was only lightly doped (e.g., at a concentration of less than $1\times10^{18}$ $cm^{-3}$), then these beneficial electrostatic short-channel effects would be lost). The steps needed to achieve a desired dopant concentration in the nanowire cores and epitaxial shells, given the teachings presented herein, would be apparent to one of skill in the art. Counter-doping may be used both in the case where the same material is used in the nanowire cores and the epitaxial shells and where different core and shell materials are used.

A gate stack 702 is then patterned surrounding the nanowire cores/epitaxial shells in a gate all around configuration. See FIG. 7. The portions of the nanowire cores/epitaxial shells surrounded by the gates stack will serve as channels of the device. Gate stack 702 contains a dielectric (or combination of dielectrics), a first gate material (such as a metal(s)) and optionally a second gate material (such as a metal or doped polysilicon layer), all that surround the nanowire cores/epitaxial shells (see FIG. 8, described below).

Figure 7:
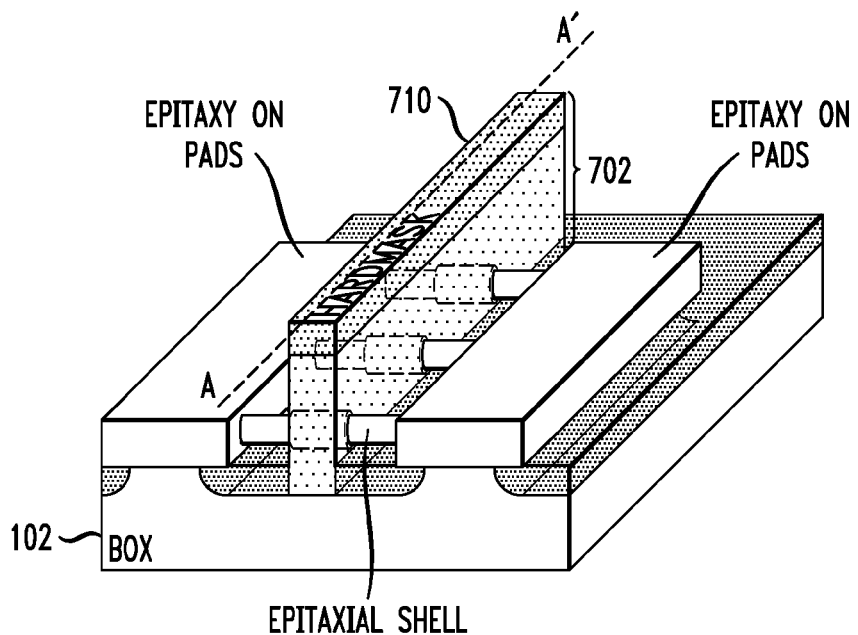
FIG. 7 is a three-dimensional diagram illustrating a gate stack having been formed surrounding the nanowire cores/epitaxial shells in a gate all around configuration according to an embodiment of the present invention.
Figure 8:
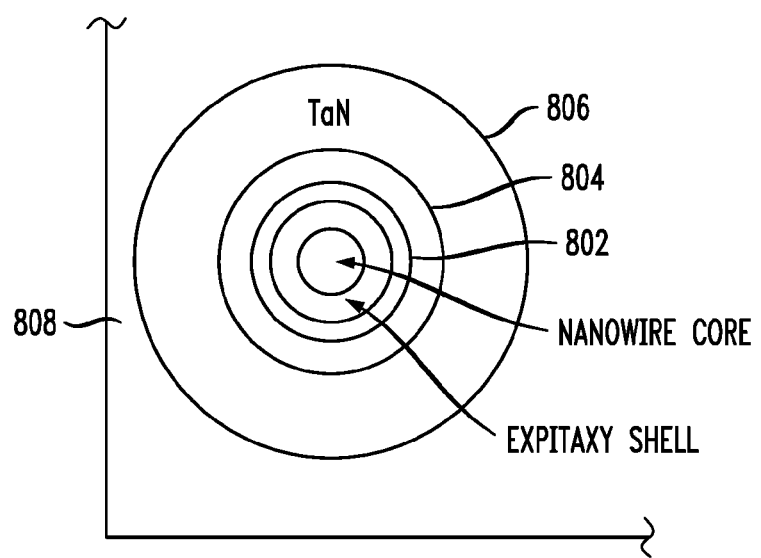
FIG. 8 is a cross-sectional diagram illustrating a cut through a portion of the gate stack according to an embodiment of the present invention.

As shown in FIG. 7, since the channels have been suspended over the BOX as described above, gate stack 702 completely surrounds at least a portion of each of the nanowire cores/epitaxial shells in a gate all around configuration.

According to an exemplary embodiment, gate stack 702 is formed by depositing a conformal gate dielectric film 802 such silicon dioxide ($SiO_2$), silicon oxynitride (SiON), hafnium oxide ($HfO_2$), or hafnium silicate (or other hi-K material) around the nanowire cores/epitaxial shells. See FIG. 8 which provides a view of a cross-sectional cut (i.e., along line A-A') through a portion of gate stack 702. Optionally, a second conformal gate dielectric film 804 that includes, for example, $HfO_2$, may be applied over gate dielectric film 802. A (first) gate material 806 is then deposited over the conformal gate dielectric film 802 (or over optional second conformal gate dielectric film 804). According to an exemplary embodiment, the gate material 806 is a conformal metal gate film that includes, for example, tantalum nitride (TaN) or titanium nitride (TiN).

Optionally, a second gate material 808 such as doped polysilicon or metal may then be blanket deposited onto the structure (i.e., over the gate material 806 so as to surround the nanowire cores/epitaxial shells). By way of reference to FIG. 7, hardmask 710 (e.g., a nitride hardmask, such as SiN) may then be formed on the second gate material, wherein the hardmask corresponds to a gate line of the nanowire FET. Standard patterning techniques can be used to form the hardmask 710. The gate material(s) and dielectric(s) are then etched by directional etching that results in straight sidewalls of the gate stack. An isotropic lateral etch is then performed to remove residue of the gate materials underneath nanowires, shadowed from the first directional etching (not shown). This lateral etch process could be accomplished by RIE or a chemical wet method. After the lateral etching step, the gate line 702 is formed over the suspended nanowires.

Figure 9:
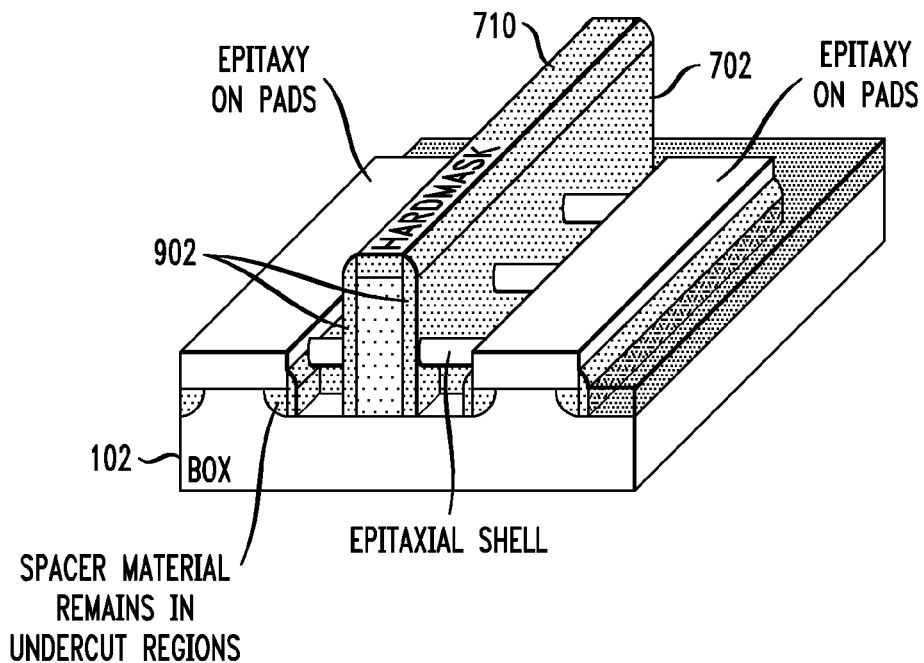
FIG. 9 is a three-dimensional diagram illustrating spacers having been formed on opposite sides of the gate stack according to an embodiment of the present invention.
Figure 10:
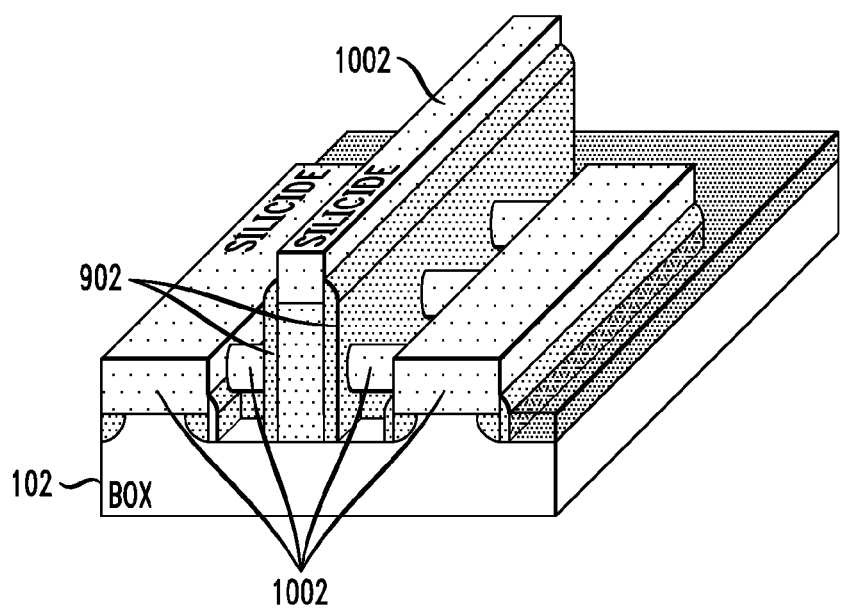
FIG. 10 is a three-dimensional diagram illustrating a contact material having been formed on the exposed epitaxial material according to an embodiment of the present invention.

Spacers 902 are formed on opposite sides of gate stack 702. See FIG. 9. According to an exemplary embodiment, spacers 902 are formed by depositing a blanket dielectric film such as silicon nitride and etching the dielectric film from all horizontal surfaces by RIE. As shown in FIG. 9, some of the deposited spacer material can remain in the undercut regions, since the RIE in that region is blocked by the pads.

Finally, a contact material such as a silicide (formed from the epitaxial Si, SiGe or SiC) 1002 is formed on the exposed epitaxial material (i.e., the epitaxial material on the pads and portions of the epitaxial shells (surrounding the nanowire cores) that extend out from the gate). See FIG. 10. As provided above, the pads and portions of the nanowire cores/epitaxial shells that extend out from the gate will serve as source and drain regions of the device. Examples of contact materials include, but are not limited to, nickel silicide or cobalt silicide. By way of example only, formation temperatures can be from about 400° C. to about 600° C. Once the contact material formation is performed, capping layers and vias for connectivity (not shown) may be formed.

Figure 11:
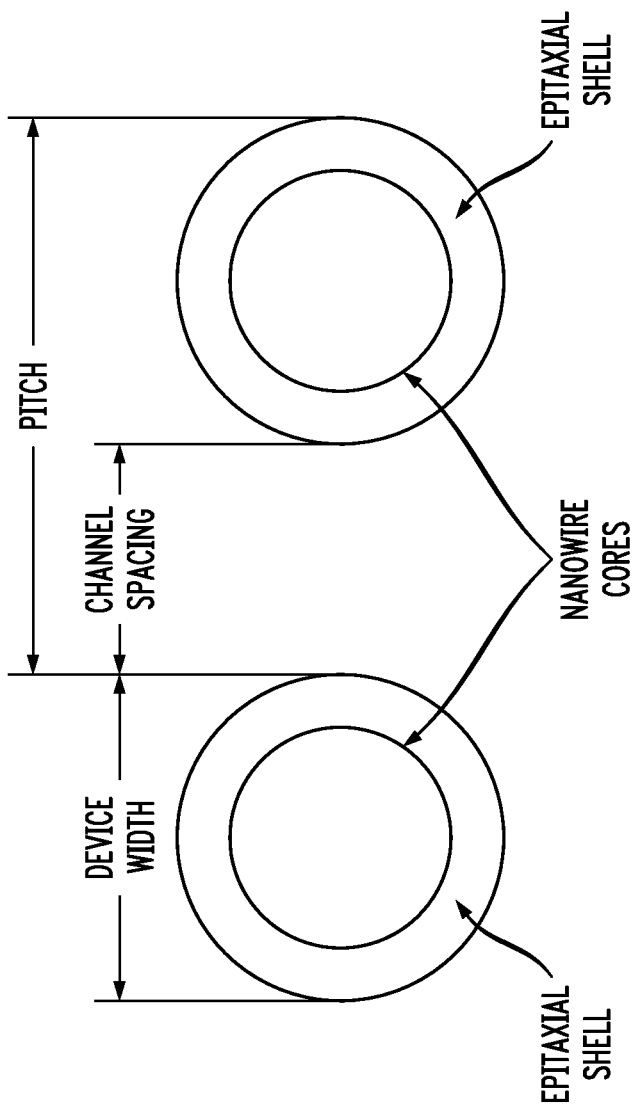
FIG. 11 is a schematic diagram illustrating effective device width, spacing between adjacent channels (channel-to-channel spacing) and channel pitch, and how by way of the present techniques, the device width is increased thereby decreasing the channel-to-channel spacing according to an embodiment of the present invention.

FIG. 11 is a schematic diagram illustrating effective device width, spacing between adjacent channels and channel pitch, and how by way of the present techniques, the effective device width is increased thereby decreasing the channel-to-channel spacing. For instance, by way of reference to FIG. 11, it can be seen that the effective device width of one of the nanowire cores is smaller than the device width of the nanowire core with the epitaxial shell around it. Accordingly, when there are channels adjacent to one another (for example as shown in FIG. 11), this increased device width decreases the channel-to-channel spacing between the adjacent channels (see FIG. 11, label "Channel spacing").

FIG. 11 also illustrates the concept of channel pitch. In the present description, channel pitch is the distance measured between a same point on each of the channels. So for example in FIG. 11, pitch is being measured based on a (same) point on the outer circumference of each of the channels. In one exemplary embodiment, the pitch of the channels in the completed device is from about 5 nm to about 50 nm, e.g., from about 20 nm to about 40 nm. It is to be noted that the present techniques are applicable to any channel pitch range, and those pitch ranges provided herein are merely exemplary. Advantageously, according to the present techniques, as provided above, the pitch of the channels in the completed device may be less than 20 nm, for instance, from about 5 nm to about 20 nm.

It is not however always necessary to form an epitaxial shell completely surrounding the nanowire cores (as described above) in order to achieve the beneficial results provided herein, i.e., being able to maintain effective device width scaling in gate all around nanowire FET devices following nanowire thinning. By way of example only, in another exemplary embodiment, the epitaxial shell is replaced with epitaxial sidewalls that extend outwards from the sidewalls of the nanowire cores. This too will serve to maintain effective device width scaling in gate all around nanowire FET devices following nanowire thinning. This alternative embodiment will be now be described by way of reference to FIGS. 12-17 which illustrate an exemplary nanowire FET device and a fabrication process flow.

Figure 12B:
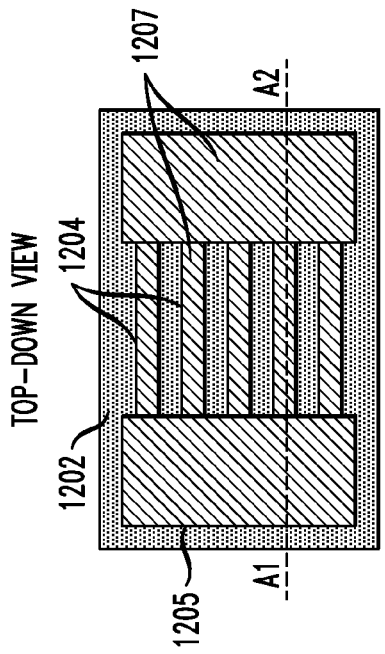
FIG. 12B is a top-down diagram of the structure of FIG. 12A according to an embodiment of the present invention.
Figure 12A:
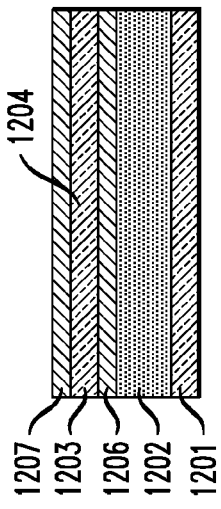
FIG. 12A is a cross-sectional diagram illustrating a starting wafer for an exemplary alternative process flow having an SOI layer (sandwiched between a buried nitride layer and a nitride cap) over a BOX according to an embodiment of the present invention.

The starting wafer for this exemplary process flow is shown in FIG. 12A. The starting wafer includes single-crystal silicon-on-insulator (SOI) layer 1203 sandwiched between a buried nitride layer 1206 and a nitride cap 1207. The wafer also includes a buried oxide (BOX) 1202 under the buried nitride layer 1206. The substrate 1201 that hosts the film stack described above may be a silicon wafer and its main purpose is mechanical support. The fabrication of such a wafer may be done by wafer bonding and layer transfer as was earlier described for the SOI wafer in the embodiment above and as further described in "Silicon-on-insulator technology," J. P. Colinge, pgs. 50-51 (1997), and "Semiconductor wafer bonding," Q. Y. Tong and U. Gosele, pgs. 72-76 (1999), the contents of both of which are incorporated by reference herein. As will be described below, the SOI layer is patterned to form a plurality of nanowires and pads. As above, the nanowires will serve as "cores" on which an epitaxial material will be formed (in this case the epitaxial material will be formed on the sidewalls of the nanowire cores, rather than as a shell surrounding the cores as above). Thus, the nanowires will herein after be referred to as nanowire cores.

FIG. 12B is a top-down diagram of the structure of FIG. 12A. Referring to FIG. 12B, the SOI layer 1203 is patterned using methods such as lithography and RIE, to form a ladder-like structure having nanowire cores 1204 and pads 1205, wherein the pads 1205 are attached to opposite ends of the nanowire cores 1204 and the nanowire cores 1204 resemble the rungs of a ladder. Note that the patterning by RIE also includes the etching of the nitride cap 1207 and the buried nitride layer 1206. The depiction in FIG. 12A represents a cross-sectional cut through the structure of FIG. 12B, i.e., along line A1-A2.

Figure 13B:
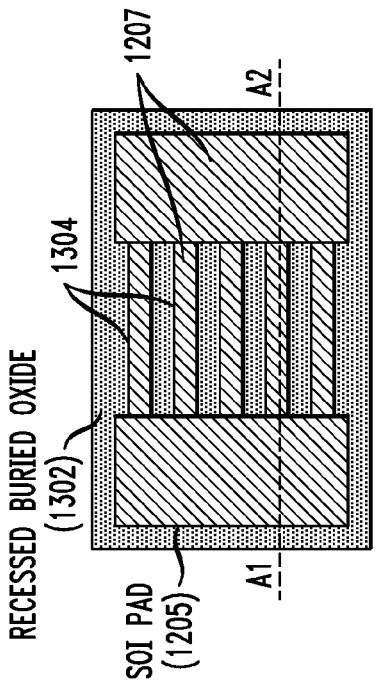
FIG. 13B is a top-down diagram of the structure of FIG. 13A according to an embodiment of the present invention.
Figure 13A:
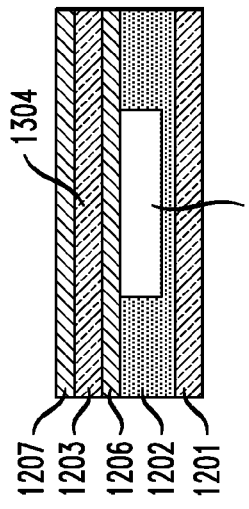
FIG. 13A is a cross-sectional diagram illustrating nanowire cores (which have been formed in the SOI layer) having been suspended by recessing a portion of the BOX beneath the nanowire cores according to an embodiment of the present invention.

Referring to FIGS. 13A (cross-sectional view) and 13B (top-down view), a portion 1302 of BOX 1202 is recessed to suspend the nanowire cores 1204. The now-suspended nanowire cores will herein after be given the reference numeral 1304. As described above, the lateral etching of the buried oxide that releases the nanowires is achieved by isotropic etching of the oxide. As an example wet etching with diluted HF (DHF) provides isotropic etching of the buried oxide while being selective to silicon and silicon nitride. FIG. 13B is a top-down diagram of the structure of FIG. 13A. The depiction in FIG. 13A represents a cross-sectional cut through the structure of FIG. 13B, i.e., along line A1-A2.

FIG. 14A shows a cross-sectional view of the suspended nanowire cores in a direction perpendicular to the nanowires (direction indicated by line B1-B2 shown in FIG. 14B). As can be seen, sidewalls of the suspended nanowire cores 1304 are exposed while top and bottom surfaces of the suspended nanowire cores 1304 are covered by the top the nitride cap 1207 and the buried nitride layer 1206. FIG. 14B is a top-down diagram of the structure of FIG. 14A. The depiction in FIG. 14A represents a cross-sectional cut through the structure of FIG. 14B, i.e., along line B1-B2.

Optionally, the exposed sidewalls of the suspended nanowire cores may now be smoothed by annealing in hydrogen ambient. The smoothing processing steps for the nanowire cores were described above, and that description is incorporated by reference herein. One notable difference in this embodiment as compared to the core/shell embodiment above is that the nanowire smoothing process here will affect only the exposed sidewalls of the suspended nanowire cores since the top and bottom surfaces of the suspended nanowire cores are covered by the top nitride cap and the buried nitride layer. Processing the sidewalls of the suspended nanowire cores is beneficial since it reduces the nanowires' line edge roughness and the smoother sidewalls provide a better surface for epitaxy.

Referring now to FIGS. 15A (cross-sectional view) and 15B (top-down view) which show the device structure following a selective epitaxial growth (labeled "sidewall epi") of silicon or another semiconductor that extends (grows) the nanowire cores in the direction parallel to the BOX 1302. The epitaxy which is selective with respect to non-silicon surfaces adds semiconductor material only over exposed silicon. No deposition takes place over silicon nitride or silicon dioxide. The selective epitaxy adds epi sidewall 1400 over the exposed sidewall surfaces of nanowires 1304. Depending on the choice of growth conditions these epi sidewalls 1400 can terminate with (111) surfaces making the growth self-limiting. The preferred growth method (e.g. CVD) was described above. Similarly the epi sidewalls 1400 can be pure Si, or SiGe, and may be doped or unintentionally doped (i.e., intrinsic). FIG. 15B is a top-down diagram of the structure of FIG. 15A. The depiction in FIG. 15A represents a cross-sectional cut through the structure of FIG. 15B, i.e., along line B1-B2. As shown in FIG. 15B, the epitaxial sidewalls extend along each nanowire core in a plane parallel to the BOX.

An advantage of this exemplary process flow is that the top nitride cap and the buried nitride layer are present during the epitaxial sidewall formation. These nitride layers can serve to anchor the nanowire cores on the top and bottom thus preventing potential agglomeration of the nanowire cores during the epi process and permitting potentially higher growth temperatures.

Figure 16B:
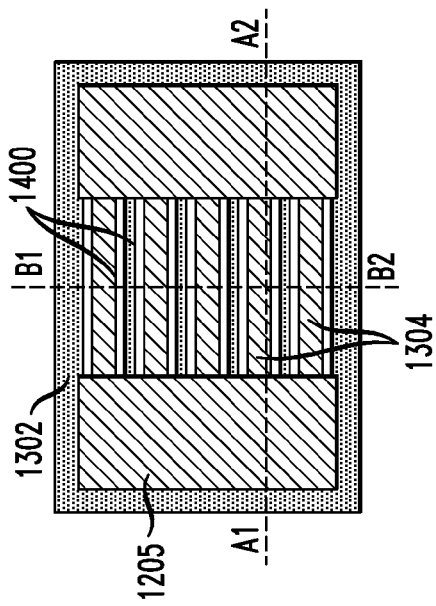
FIG. 16B is a top-down diagram of the structure of FIG. 16A according to an embodiment of the present invention.
Figure 16A:
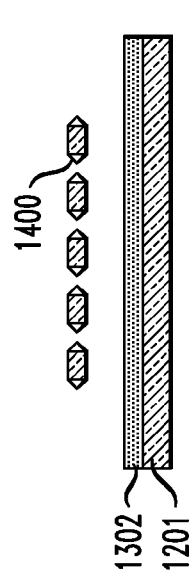
FIG. 16A is a cross-sectional diagram illustrating the top nitride cap and the buried nitride layer having been removed from the suspended nanowire cores by a selective etch according to an embodiment of the present invention.

Referring to FIGS. 16A (cross-sectional view) and 16B (top-down view) the top nitride cap 1207 and the buried nitride layer 1206 are removed from the nanowire cores by a selective etch, such as hot phosphoric acid (T=180° C.). FIG. 16B is a top-down diagram of the structure of FIG. 16A. The depiction in FIG. 16A represents a cross-sectional cut through the structure of FIG. 16B, i.e., along line B1-B2. It is notable that, while not visible in FIG. 16B, the buried nitride is still present under the pads. What is important here is that the buried nitride layer and the nitride cap are removed from the nanowire cores.

Figure 17:
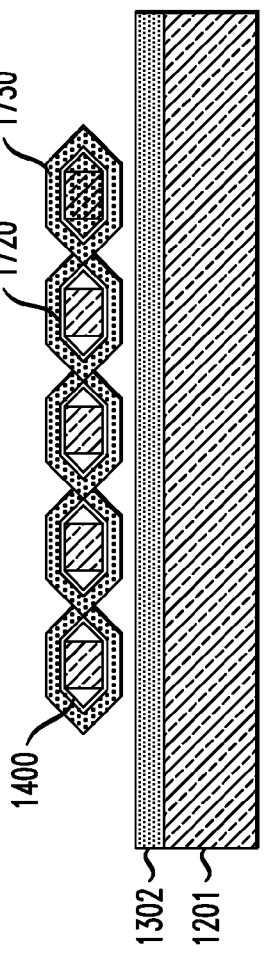
FIG. 17 is a cross-sectional diagram illustrating a gate stack having been formed surrounding the suspended nanowire cores according to an embodiment of the present invention.

FIG. 17 depicts an enlarged view of the structure of FIG. 16A following the conformal deposition of a gate stack (surrounding the suspended nanowire cores) which includes a gate dielectric 1720 and a gate conductor 1730. The process for fabricating the gate stack was provided above, and that description is incorporated by reference herein. It is notable that the shape of the gate stack formed can vary depending on the amount of gate stack material deposited. For instance, as shown in FIG. 17, when conformal layers of gate stack materials are deposited, the gate stack can take on a faceted shape (due, for example, to the presence of the epitaxial sidewalls on the nanowire cores). Alternatively, the faceting can be eliminated by depositing a greater amount of gate stack materials which will result in a gate stack shape the same as that shown for example in FIG. 7, described above.

It is to be understood that the device and/or processing parameters described above with regard to the nanowire core/epitaxial shell embodiment which have not been repeated here in the description of the nanowire core/epitaxial sidewalls embodiment should be considered to be incorporated by reference as if fully set forth herein. Thus, by way of example only, the same channel pitch specifications set forth above are intended to apply to the instant embodiment.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a field effect transistor (FET) device, comprising the steps of:
   providing a semiconductor-on-insulator (SOI) wafer having an SOI layer over a buried oxide (BOX), wherein the SOI layer is present between a buried nitride layer beneath the SOI layer and a nitride cap above the SOI layer;
   etching the SOI layer, the buried nitride layer and the nitride cap to form nanowire cores and pads in the SOI layer, wherein the pads are attached at opposite ends of the nanowire cores in a ladder-like configuration, wherein the buried nitride layer is present beneath each of the nanowire cores and the nitride cap is present on top of each of the nanowire cores, and wherein sidewalls of the nanowire cores are exposed;
   suspending the nanowire cores over the BOX;
   forming epitaxial sidewalls over the sidewalls of the nanowires cores;
   removing the buried nitride layer and the nitride cap from the nanowire cores; and
   forming a gate stack that surrounds at least a portion of each of the nanowire cores and the epitaxial sidewalls, wherein the portions of the nanowire cores and the epitaxial sidewalls surrounded by the gate stack serve as channels of the device, wherein the pads and portions of the nanowire cores and the epitaxial sidewalls that extend out from the gate stack serve as source and drain regions of the device.

2. The method of claim 1, wherein the channels of the device have a pitch of from about 5 nm to about 50 nm.

3. The method of claim 1, wherein the channels of the device have a pitch of from about 20 nm to about 40 nm.

4. The method of claim 1, further comprising the step of: thinning the nanowire cores.

5. The method of claim 1, wherein the SOI layer comprises a semiconducting material selected from the group consisting of: silicon, silicon germanium and silicon carbon.

6. The method of claim 1, wherein the nanowire cores are doped with either an n-type dopant or a p-type dopant.

7. The method of claim 1, wherein the nanowire cores are undoped.

8. The method of claim 4, wherein the step of thinning the nanowire cores comprises the steps of:
   oxidizing the nanowire cores to form an oxide on the nanowire cores;
   etching the oxide formed on the nanowire cores; and
   repeating the oxidizing and etching steps until a desired nanowire dimension is achieved.

9. The method of claim 1, wherein the epitaxial sidewalls are doped with either an n-type dopant or a p-type dopant.

10. The method of claim 1, wherein the epitaxial sidewalls are undoped.

11. The method of claim 1, wherein the epitaxial sidewalls comprise epitaxial silicon, silicon germanium or silicon carbon.

12. The method of claim 1, wherein the step of forming the gate stack comprises the steps of:

depositing a conformal gate dielectric film around the nanowire cores and the epitaxial sidewalls;

depositing a conformal metal gate film over the conformal gate dielectric film;

depositing polysilicon over the conformal metal gate film; and patterning the polysilicon, the conformal gate dielectric film and the conformal metal gate film using a hardmask to form the gate stack.

13. The method of claim 12, wherein the conformal gate dielectric film is selected from the group consisting of: silicon dioxide, silicon oxynitride, hafnium oxide and hafnium silicate.

14. The method of claim 12, wherein the conformal metal gate film is selected from the group consisting of: tantalum nitride and titanium nitride.

15. The method of claim 1, wherein the buried nitride layer and the nitride cap are removed from the nanowire cores using a phosphoric acid etch.

16. A FET device, comprising:

a wafer having a buried oxide (BOX);

nanowire cores and pads attached at opposite ends of the nanowire cores in a ladder-like configuration on the BOX, wherein the nanowire cores are suspended over the BOX, and wherein the nanowire cores each have two flat opposing sidewalls;

epitaxial sidewall covering only the two flat opposing sidewalls of the nanowire cores and which extend along each of the nanowire cores in a plane parallel to the BOX; and a gate stack that surrounds at least a portion of each of the nanowire cores and the epitaxial sidewalls, wherein the portions of the nanowire cores and the epitaxial sidewalls surrounded by the gate stack serve as channels of the device, wherein the pads and portions of the nanowire cores and the epitaxial sidewalls that extend out from the gate stack serve as source and drain regions of the device.

17. The FET device of claim 16, wherein the nanowire cores are doped with either an n-type dopant or a p-type dopant.

18. The FET device of claim 16, wherein the nanowire cores are undoped.

19. The FET device of claim 16, wherein the epitaxial sidewalls are doped with either an n-type dopant or a p-type dopant.

20. The FET device of claim 16, wherein the epitaxial sidewalls are undoped.

21. The FET device of claim 16, wherein the channels of the device have a pitch of from about 5 nm to about 50 nm.

22. The FET device of claim 16, wherein the channels of the device have a pitch of from about 20 nm to about 40 nm.

* * * * *